United States Patent
Ji

(10) Patent No.: US 6,391,712 B2
(45) Date of Patent: May 21, 2002

(54) METHOD OF FORMING A STORAGE NODE OF A CAPACITOR THAT PREVENTS HSG (HEMI-SPHERICAL GRAIN) BRIDGING

(75) Inventor: Pil-Seon Ji, Cheongju (KR)

(73) Assignee: Hynix Semiconductor, Inc., Kyoungki-Do (KR)

(*) Notice: Subject to any disclaimer, the term of this patent is extended or adjusted under 35 U.S.C. 154(b) by 0 days.

(21) Appl. No.: 09/842,249

(22) Filed: Apr. 26, 2001

(30) Foreign Application Priority Data

Aug. 11, 2000 (KR) .......................................... 00/46617

(51) Int. Cl.$^7$ .......................................... H01L 21/8242
(52) U.S. Cl. ...................... 438/253; 438/396; 257/303; 257/306
(58) Field of Search ................................ 438/253–256, 438/396–389; 257/306, 303, 304, 307

(56) References Cited

U.S. PATENT DOCUMENTS

| 5,989,952 A | * | 11/1999 | Jen et al. ...................... 438/253 |
| 6,037,219 A | * | 3/2000 | Lin et al. ...................... 438/255 |
| 6,255,687 B1 | * | 7/2001 | Figura et al. ............... 257/309 |

* cited by examiner

Primary Examiner—David Nelms
Assistant Examiner—Dung A Le
(74) Attorney, Agent, or Firm—Birch, Stewart, Kolasch & Birch, LLP

(57) ABSTRACT

The method of forming a lower electrode of a capacitor includes forming an first insulation film over a substrate, and forming a trench in the first insulation film to expose an electrical contact structure. Then, a second insulation film is formed along sidewalls of the trench, and an amorphous silicon film is formed in the trench. The second insulation film is removed so that sidewalls of the amorphous silicon film are separated from sidewalls of the trench, and HSG is grown on exposed surfaces of the amorphous silicon film.

17 Claims, 4 Drawing Sheets

METHOD OF FORMING A STORAGE NODE OF A CAPACITOR THAT PREVENTS HSG (HEMI-SPHERICAL GRAIN) BRIDGING

BACKGROUND OF THE INVENTION

1. Field of the Invention

The present invention relates to a method of forming a storage node of a Capacitor.

2. Description of the Background Art

With the development of fabrication techniques for a semiconductor device, and the extension of the applicable fields thereof, mass storage devices are being developed. In addition, with the high integration of a circuit, the area of a unit memory cell is being decreased, and cell capacitance is also being decreased. In particular, in a DRAM(Dynamic Random Access Memory), using a capacitor as an information storage unit and including a switching transistor as a controllable signal transfer unit connected to the capacitor, since a decrease in cell capacitance according to the decrease in unit memory cell area degrades the readability of a memory cell and increases soft error rate, the problem of the increase in cell capacitance must be solved for high integration of a semiconductor memory device.

The basic structure for the capacitor in the memory cell includes a lower electrode, dielectric film, and an upper electrode, and as a method for obtaining a larger capacitance in a small area, the following studies are being made.

First, the thickness of a dielectric film is closely connected with dielectric properties, and the main factors for limiting thickness are a leakage current and breakdown voltage of a dielectric. With a given thickness of the dielectric film, as the leakage current becomes smaller and the breakdown voltage becomes larger, the dielectric becomes better.

Second, in order to increase the effective area of the capacitor, various types of capacitors, such as a planar-type, trench-type, stack-type, cylinder type-type, combination thereof, etc., are formed.

Third, a high dielectric having a smaller leakage current, larger breakdown voltage, and larger dielectric constant can make the thickness of a dielectric film smaller than the physical thickness thereof, and can decrease the size of a memory cell and increase capacitance.

Among a variety of methods for increasing the effective area of a capacitor, the method for increasing capacitance by increasing the surface area of a capacitor by growing hemispherical grains (hereinafter, HSG) on the surface of a storage node, generally, a lower electrode, in a DRAM device of 16~256 MB is more frequently applied than other methods for increasing the surface area of a capacitor by forming a capacitor structure in a three-dimensional structure, such as a trench-type, cylinder-type, etc. The above method for increasing capacitance by growing HSG on the surface of a storage node is a method using an unique physical phenomenon, which occurs in a process of phase-changing amorphous silicon into polycrystal silicon. When heat is applied to amorphous silicon after depositing the amorphous silicon on the surface of a storage node, the amorphous silicon forms fine hemispherical grains to thus be changed into polycrystal silicon having an uneven surface. The surface of the storage node of the thusly-formed HSG polycrystal silicon capacitor has a surface area 2–3 times larger than a conventional smooth surface capacitor.

After the HSG growth, however, a bridge between storage nodes of the capacitor occurs due to additional growth of HSG or breakdown of HSG by thermal treatment in the successive process, thus decreasing product yield. FIG. 1A is a cross-sectional view illustrating a DRAM cell having HSG grown on inner walls and outer walls of a cup-type storage node. Reference numeral 1 denotes a gate, 2 denotes a landing pad, 3 denotes a bit line, 4 denotes a storage node contact, 5 denotes a nitride film, 6 denotes a storage node, and 7 denotes HSG, respectively. It is shown that the HSG grown on the inner and outer walls of two adjacent storage nodes are connected with one another; thereby forming a HSG bridge.

To suppress the formation of such a HSG bridge, HSG can be grown only on the inner walls of the storage node. FIG. 1B is a cross-sectional view illustrating a DRAM cell having grown HSG only on the inner walls of the cup-type storage node, wherein it is shown that HSG 7 are separated from one another by a nitride film 9. In this case, however, since the HSG.7 are grown only on the inner walls of the storage node 6, capacitance is decreased as compared to the case of growing the HSG 7 on both inner and outer walls of the storage node 6 as in FIG. 1A.

SUMMARY OF THE INVENTION

Accordingly, it is an object of the present invention to provide a method of forming a storage node of a capacitor that prevents HSG bridging while improving capacitance by growing HSG on inner and outer walls of the storage node of the capacitor.

To achieve the above object, there is provided a method of preventing HSG bridging using a nitride-spacer according to the present invention, which includes the steps of: forming a storage node of a capacitor, comprising: forming an first insulation film over a substrate; forming a trench in the first insulation film to expose an electrical contact structure; forming a second insulation film along sidewalls of the trench; forming an amorphous silicon film in the trench; removing the second insulation film so that sidewalls of the amorphous silicon film are separated from sidewalls of the trench; and growing HSG on exposed surfaces of the amorphous silicon film.

To form the second insulation film, dry etching is carried out. The second insulation film is made to have a thickness of 200~500 Å. Also, the amorphous silicon film is planarized using a planarization film, e.g., SOG (silicon oxide glass) or PSG (phosphosilicate glass).

By this method, the first insulation film serves as a barrier between storage nodes, and the second insulation film provides a space for growing HSG on the outer walls of the storage node, thus growing HSG on both inner and outer walls of the storage node without bridging.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The preferred embodiment of the present invention will now be described in detail with reference to the accompanying drawings.

FIGS. 2A through 2I illustrate the process steps of an embodiment of the method according to the present invention.

Figure 1A:
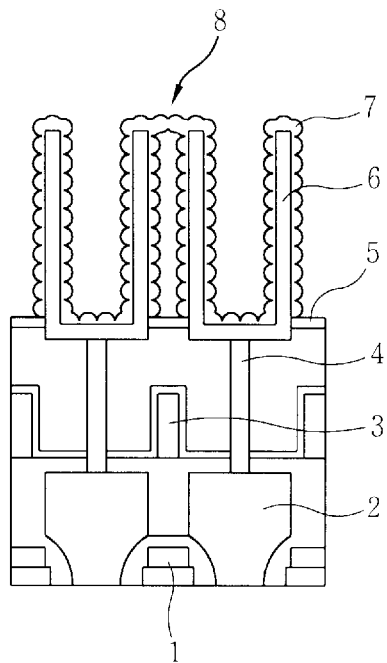
FIG. 1A is a cross-sectional view illustrating a DRAM cell having grown HSG on inner and outer walls of a cup-type storage node.
Figure 1B:
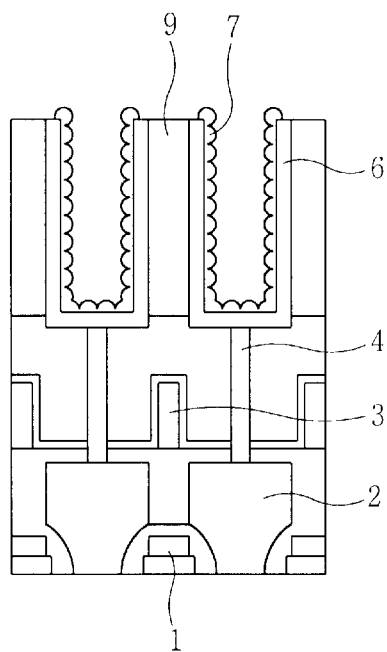
FIG. 1B is a cross-sectional view illustrating a DRAM cell having grown HSG only on the inner walls of the storage node.
Figure 2A:
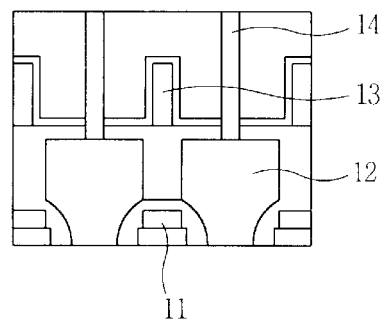
FIG. 2A is a cross-sectional view illustrating the step of forming a storage node contact according to a first embodiment of the present invention.

FIG. 2A is a cross-sectional view illustrating parts of a DRAM cell having a transistor and a bit line. On a landing pad 12 disposed between gates 11, a storage node contact 14 for electrically connecting a transistor and a storage node of a capacitor is disposed.

Figure 2B:
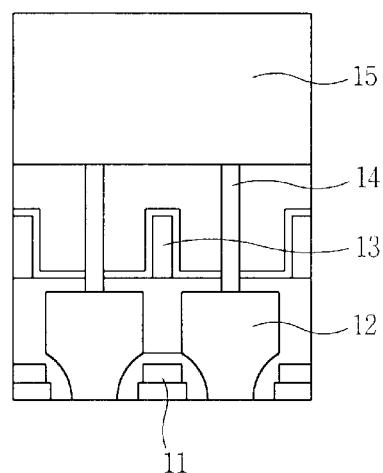
FIG. 2B is a cross-sectional view illustrating the step of depositing a storage node oxide film according to the first embodiment of the present invention.
Figure 2C:
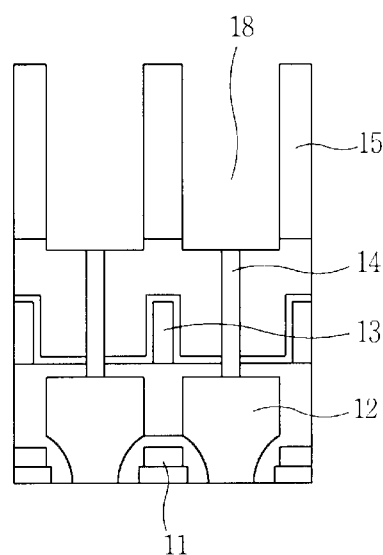
FIG. 2C is a cross-sectional view illustrating the step of etching the storage node oxide film according to the first embodiment of the present invention.

After forming the storage node contact, as illustrated in FIG. 2B, a storage node oxide film 15 is formed. At this time, the oxide film is made to have a proper thickness in consideration of a capacitor to be formed later. The oxide film is deposited by PECVD(plasma enhanced chemical vapor deposition) or LPCVD(low pressure chemical vapor deposition) of TEOS(tetraethyl orthosilicate).

Next, in order to fabricate the capacitor, a lithography ("litho") process is carried out on the storage node oxide film 15, and the storage node oxide film 15 corresponding to an upper portion of the storage node contact 14 is etched (refer to FIG. 2C) to form trench region 18. In this case, it is preferred that the storage node oxide film 15 is etched slightly below the bottom surface of the oxide film so that a storage node to be formed later is electrically contacted with the storage node contact 14 with ease. The etching is done with a dry etching process.

Figure 2D:
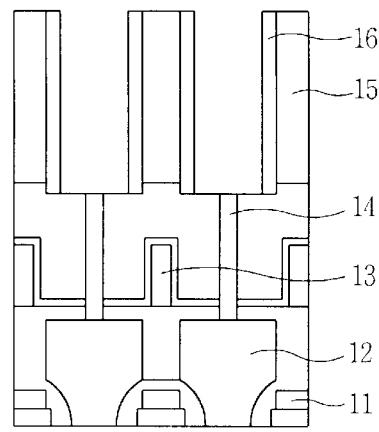
FIG. 2D is a cross-sectional view illustrating the step of forming a nitride-spacer according to the first embodiment of the present invention.

FIG. 2D illustrates the step of fabricating a nitride-spacer. After etching the storage node oxide film 15, a storage node nitride film is deposited, and the deposited storage node nitride film is etched after the litho process to thereby form nitride-spacers 16 on sidewalls of the trench region 18. The deposition of the storage node nitride film is done by PECVD or LPCVD, and dry etching is carried out in order to form the nitride-spacers 16. The storage node nitride film is deposited at a temperature range of 350~450° C., in case of PECVD, or at a temperature range of 700~800°, in case of LPCVD. It is proper that the nitride-spacers 16 have a thickness of 200~500 Å in consideration of growing,HSG on a storage node later.

Figure 2E:
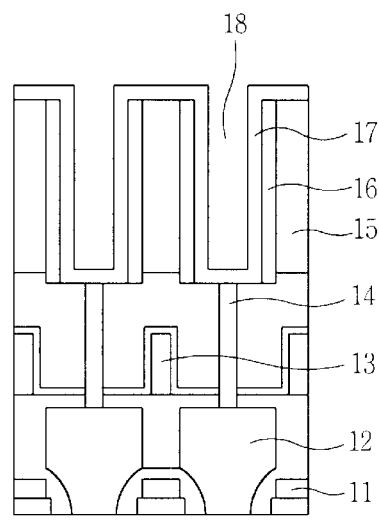
FIG. 2E is a cross-sectional view illustrating the step of depositing an amorphous silicon film according to the first embodiment of the present invention.
Figure 2F:
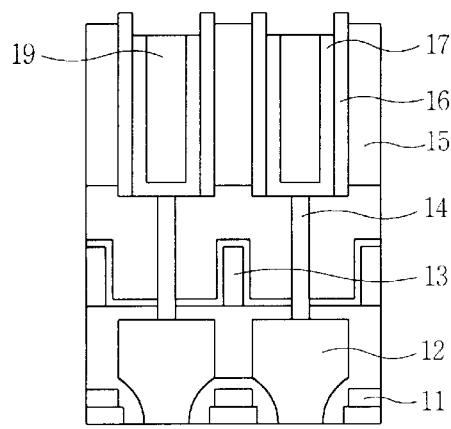
FIG. 2F is a cross-sectional view illustrating the step of forming planarization film in a planarization process according to the first embodiment of the present invention.

After forming the nitride-spacers, an amorphous silicon film 17 is deposited in order to fabricate a storage node (refer to FIG. 2E).

After depositing the amorphous silicon film 17, a planarization process is carried out in order to fabricate the amorphous silicon film in the form of a storage node (refer to 2F). In this step, first, the trench region 18 enclosed by the amorphous silicon film 17 is filled with a planarization film 19. As the planarization film 19, SOG is coated, or PSG is deposited by APCVD (atmospheric pressure chemical vapor deposition). After filling the trench region 18 with the planarization film 19, the storage node is made to have a proper height by etching back the SOG, in a case that the trench region 18 is coated with SOG, or by chemical-mechanical polishing (CMP), in a case that the trench region 18 is deposited with the PSG.

If etching back or CMP is carried out by the above planarization process, parts of the amorphous silicon film is removed, thus removing the amorphous silicon film deposited on the oxide film 15 and leaving the amorphous silicon film only at the trench region 18.

Figure 2G:
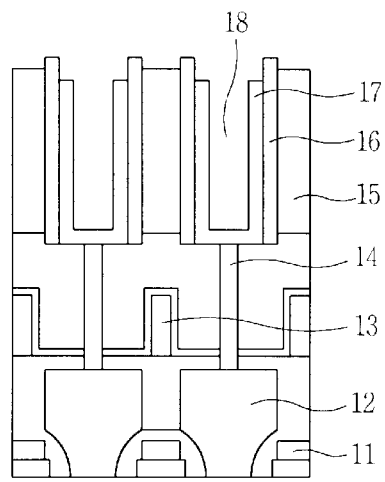
FIG. 2G is a cross-sectional view illustrating the step of removing the planarization film in the planarization process according to the first embodiment of the present invention.

In the next step, the above SOG or PSG is removed for thereby causing the trench region 18 to include any empty space surrounded by the amorphous silicon 17 (refer to FIG. 2G). At this time, the SOG or PSG is removed by wet etching.

Figure 2H:
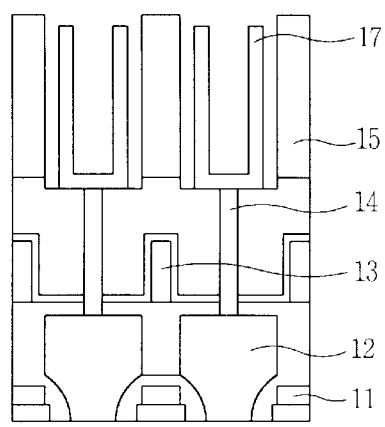
FIG. 2H is a cross-sectional view illustrating the step of removing the nitride-spacer contact according to the first embodiment of the present invention.

After removing the SOG or PSG, the nitride-spacer 16 is removed to thereby make the amorphous silicon film 17 assume the complete form of a storage node (refer to FIG. 2H). At this time, the nitride-spacer 16 is removed by wet etching. As illustrated in FIG. 2H, the storage node made of the amorphous silicon film 17 is separated from the oxide film 15.

Figure 2I:
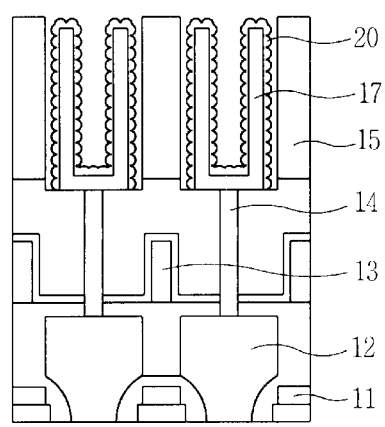
FIG. 2I is a cross-sectional view illustrating the step of forming HSG on the storage node according to the first embodiment of the present invention.

Next, if the amorphous silicon is phase-changed into polycrystal silicon, the HSG 20 is grown on the amorphous silicon surface (refer to FIG. 2I). In FIG. 2I, the storage node 17 at which HSG 20 is grown is shown. The storage node 17 is separated from the oxide film 15, and the HSG 20 grown at the storage node 17 at both sides does not cause a bridging, because the oxide film 15 functions as a barrier.

Though not illustrated in the drawings, a dielectric film is deposited on a lower electrode in a subsequent process, and an upper electrode is deposited on the dielectric film, thereby completing the capacitor.

According to the present invention, it is possible to suppress bridging of the storage node due to additional growth or breakdown of HSG by means of the nitride-spacer; the bridging being generated by the amorphous silicon film deposited on outer walls of the storage node in the conventional cup-type capacitor.

In addition, the present invention is good for securing capacitance, since both the inner and outer walls have HSG grown thereon, as compared to the case of using only inner walls of the storage node of the cup-type capacitor.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method of forming a storage node of a capacitor, comprising:

forming an first insulation film over a substrate;

forming a trench in the first insulation film to expose an electrical contact structure;

forming a second insulation film along sidewalls of the trench;

forming an amorphous silicon film in the trench;

removing the second insulation film so that sidewalls of the amorphous silicon film are separated from sidewalls of the trench; and growing HSG on exposed surfaces of the amorphous silicon film.

2. The method according to claim 1, wherein the forming a trench step includes etching below a lower surface of the first insulation film.

3. The method according to claim 1, after the forming an amorphous silicon film step and prior to the removing step, further comprising:

filling the trench with a planarizing film; and planarizing the amorphous silicon film and the planarizing film.

4. The method according to claim 3, after the planarizing step and prior to the growing step, further comprising:

removing the planarizing film.

5. The method according to claim 1, wherein the first insulating film is an oxide film and the second insulating film is a nitride film.

6. The method according to claim 1, wherein the forming a second insulation film step deposits a nitride film at a temperature range of 350~450° C. by PECVD.

7. The method according to claim 1, wherein the forming of a second insulation film step deposits a nitride film at a temperature range of 700~800° C. by LPCVD.

8. The method according to claim 1, wherein the forming a second insulation film step includes patterning and dry etching a nitride film.

9. The method according to claim 1, wherein the second insulation film has a thickness of 200~500 Å.

10. The method according to claim 3, wherein the planarization film is made of SOG (silicon oxide glass).

11. The method according to claim 10, wherein the filling step coats the trench with SOG; and the planarizing step etches back the SOG.

12. The method according to claim 4, wherein the planarizing film is made of SOG (silicon oxide glass) and the removing of the planarizing film step is performed by wet etching.

13. The method according to claim 3, wherein the planarization film is made of PSG (phosphosilicate glass).

14. The method according to claim 13, wherein the filling step deposits PSG in the trench by APCVD (atmospheric pressure chemical vapor deposition); and the planarizing step chemical-mechanically polishes (CMP) the PSG.

15. The method according to claim 4, wherein the planarizing film is made of PSG (phosphosilicate glass) and the removing of the planarizing film step is performed by wet etching.

16. The method according to claim 1, wherein the removing step is performed by wet etching.

17. The method according to claim 1, wherein the forming a trench step forms a cup-shaped trench so that the amorphous silicon film forms a cup-shaped lower electrode of a capacitor.

* * * * *